(12) United States Patent
Furuyama (10) Patent No.: US 12,489,084 B2
(45) Date of Patent: Dec. 2, 2025

(54) SEMICONDUCTOR MODULE ARRAY DEVICE

(71) Applicant: KABUSHIKI KAISHA TOSHIBA, Tokyo (JP)

(72) Inventor: Hideto Furuyama, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 754 days.

(21) Appl. No.: 17/821,579

(22) Filed: Aug. 23, 2022

(65) Prior Publication Data

US 2023/0290753 A1 Sep. 14, 2023

(30) Foreign Application Priority Data

Mar. 10, 2022 (JP) ................................ 2022-036871

(51) Int. Cl.
*H01L 25/065* (2023.01)
*H01L 23/00* (2006.01)

(52) U.S. Cl.
CPC .......... *H01L 25/0652* (2013.01); *H01L 24/29* (2013.01); *H01L 24/32* (2013.01); *H01L 2224/29111* (2013.01); *H01L 2224/29139* (2013.01); *H01L 2224/29147* (2013.01); *H01L 2224/32057* (2013.01); *H01L 2224/32227* (2013.01); *H01L 2224/32238* (2013.01); *H01L 2924/12043* (2013.01); *H01L 2924/13056* (2013.01)

(58) Field of Classification Search
CPC ............. H01L 25/0652; H01L 25/0655; H01L 23/544; H01L 24/32; H01L 2223/54426; H01L 24/09
See application file for complete search history.

(56) References Cited

U.S. PATENT DOCUMENTS

| | | | |
|---|---|---|---|
| 8,067,842 B2 * | 11/2011 | Simon | H01L 23/544 257/431 |
| 8,420,498 B2 * | 4/2013 | Tanemura | H01L 22/20 257/E21.524 |
| 2020/0286833 A1 | 9/2020 | Furuyama | |
| 2021/0035900 A1 | 2/2021 | Kurita et al. | |

FOREIGN PATENT DOCUMENTS

| | | |
|---|---|---|
| JP | 11-74619 A | 3/1999 |
| JP | 2020-145403 A | 9/2020 |
| JP | 2021-27059 A | 2/2021 |
| KR | 10-2018-0016890 A | 2/2018 |

* cited by examiner

*Primary Examiner* — Phat X Cao (74) *Attorney, Agent, or Firm* — Oblon, McClelland, Maier & Neustadt, L.L.P.

(57) ABSTRACT

A distance between outermost parts of alignment chips in a direction normal to a surface of a substrate is different between a first direction and a second direction along terminal placement surfaces. The plurality of alignment chips include a first alignment chip fixed to a first metal pad, and a second alignment chip fixed to a second metal pad. The first alignment chip and the second alignment chip are oriented in different directions on the surface of the substrate. A semiconductor module includes a first side surface part extending in the second direction and facing the first alignment chip, and a groove part formed in a portion of the first side surface part. A portion of the second alignment chip is positioned in the groove part.

15 Claims, 4 Drawing Sheets

SEMICONDUCTOR MODULE ARRAY DEVICE

CROSS-REFERENCE TO RELATED APPLICATION

This application is based upon and claims the benefit of priority from Japanese Patent Application No. 2022-036871, filed on Mar. 10, 2022; the entire contents of which are incorporated herein by reference.

FIELD

Embodiments described herein relate to a semiconductor module array device.

BACKGROUND

Packages of semiconductor integrated circuits include, for example, a LGA (Land Grid Array) package that can be mounted to a mounting substrate by using a socket or the like without using a fixed connection of solder or the like, and is a repairable package that can be detached from and re-attached to the mounting substrate.

DETAILED DESCRIPTION

According to one embodiment, a semiconductor module array device includes a substrate including a surface, the surface including a plurality of alignment regions arranged in a first direction, and a mounting region positioned between two adjacent alignment regions among the plurality of alignment regions in the first direction; a plurality of electrode pads located in the mounting region; a first metal pad and a second metal pad arranged in a second direction in the alignment region, the second direction being orthogonal to the first direction; a plurality of semiconductor modules mounted in the mounting region of the substrate, the plurality of semiconductor modules including terminal placement surfaces facing the mounting region; a plurality of module terminals located at the terminal placement surface, the plurality of module terminals being electrically connected with the electrode pads; and a plurality of alignment chips having a same shape. A distance between outermost parts of the alignment chips in a direction normal to the surface of the substrate is different between the first direction and the second direction along the terminal placement surfaces. The plurality of alignment chips include a first alignment chip fixed to the first metal pad, and a second alignment chip fixed to the second metal pad. The first alignment chip and the second alignment chip are oriented in different directions on the surface of the substrate. The semiconductor module includes a first side surface part extending in the second direction and facing the first alignment chip, and a groove part formed in a portion of the first side surface part. A portion of the second alignment chip is positioned in the groove part.

Embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

Repairable packages such as LGA and the like have a limited pitch of about 0.5 mm between the electrodes connected to the mounting substrate; for example, JP-A 2020-145403 (Kokai) and the like are known as technology to further reduce the pitch (e.g., 0.3 mm pitch); and JP-A 2021-27059 (Kokai) and the like are known as technology that aligns the narrow-pitch electrodes of the semiconductor package with the connection electrodes of the mounting substrate.

However, it is impossible to infinitely reduce the pitch of the connection electrodes of the semiconductor package, and it is necessary to ensure the number of terminals by increasing the semiconductor package size when it becomes necessary to increase the number of connection terminals between semiconductor chips such as in a large-scale information processing device, etc. However, as the semiconductor package size is increased, the distance to the connection electrode from the semiconductor chip to be mounted becomes markedly different between the electrodes, the wiring bandwidth is undesirably different between the connection terminals, and the performance of the information processing device or the like is thereby limited by the bandwidth of the longest interconnect due to the performance difference between many interconnects.

Therefore, when it is necessary to increase the number of connection terminals between the semiconductor chips, the overall performance of the information processing device or the like can be improved more by subdividing the semiconductor chips into functional blocks of some scale and by distributively mounting the semiconductor chips in multiple packages.

The embodiment is directed to a semiconductor module array device in which the device performance is drastically improved by distributively mounting such semiconductor chips of similar functions in multiple semiconductor packages and by mounting the multiple semiconductor packages in a high density array. Also, even if a portion of the semiconductor module array fails, the function of the semiconductor module array device can be maintained because only the semiconductor package of the failed part is partially replaceable (repairable).

Such a distributively-mounted semiconductor module array device is advantageous in that not only can the semiconductor chip and its mounting yield be increased because the semiconductor chip size is relatively small, but also because the dispersed arrangement of the semiconductor chips (the packages) allows more efficient overall heat dissipation of the semiconductor chips compared to when dissipating the heat generated by the large local electrical power of a huge semiconductor chip.

Figure 1:
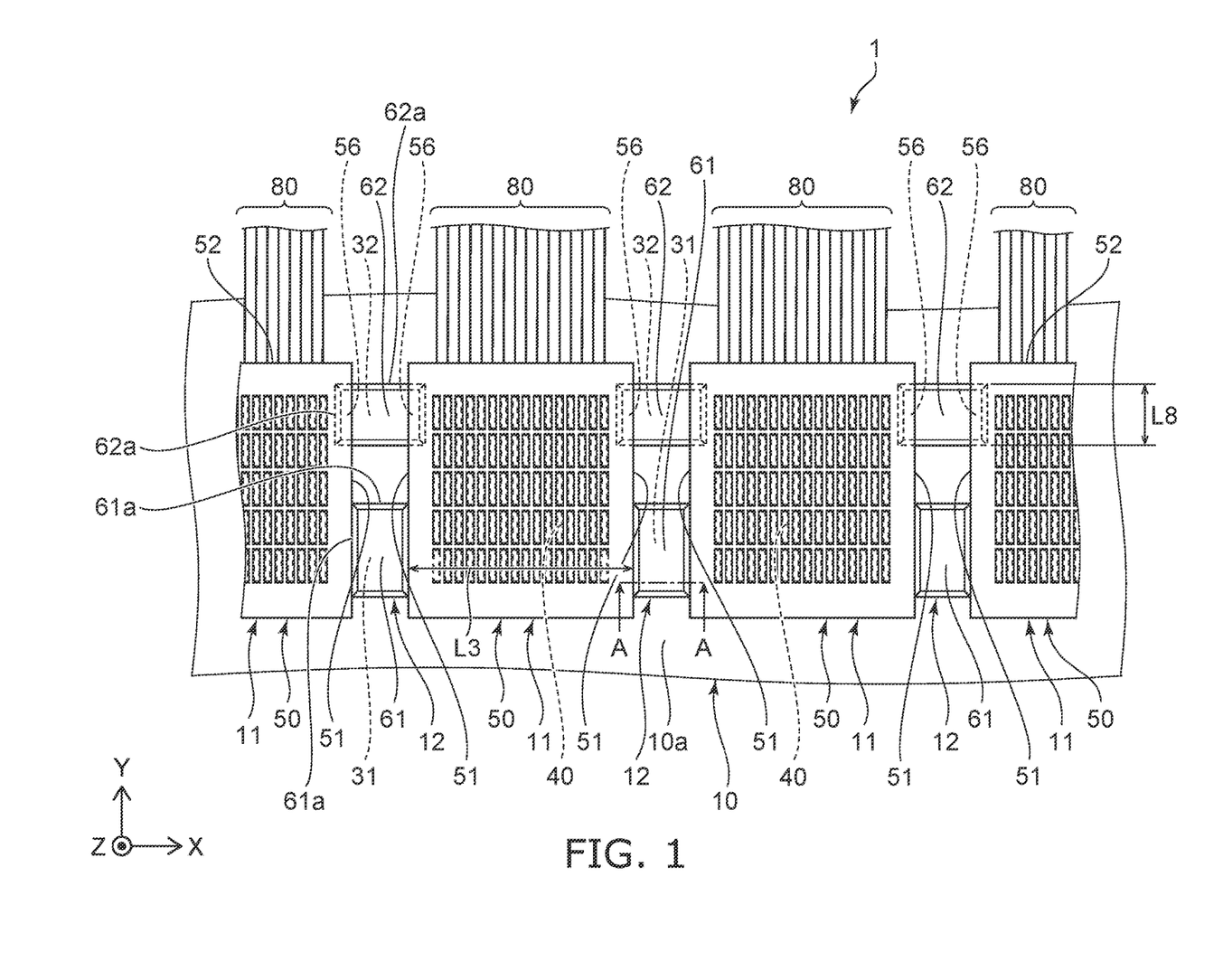
FIG. 1 is a schematic plan view of a semiconductor module array device of an embodiment.

As shown in FIG. 1, the semiconductor module array device 1 of the embodiment includes a substrate 10, multiple semiconductor modules 50, multiple first alignment chips 61, and multiple second alignment chips 62. Two directions that are orthogonal to each other and parallel to a surface of the substrate 10 are taken as a first direction X and a second direction Y. A direction orthogonal to the first and second directions X and Y is taken as a third direction Z.

Figure 4:
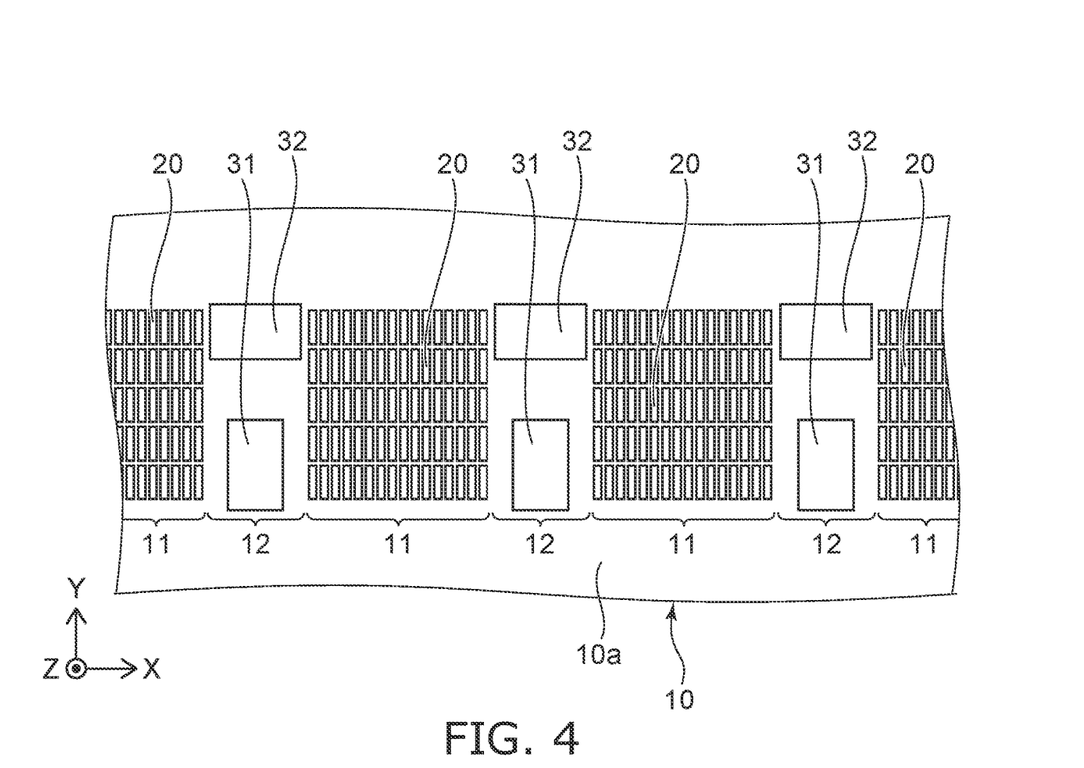
FIG. 4 is a schematic plan view of a substrate, electrode pads, and metal pads of the embodiment.

The substrate 10 is made of an insulative material. For example, a resin, ceramic, glass, or the like, a composite material of such materials, etc., can be used as the material of the substrate 10. As shown in FIG. 4, a surface 10a of the substrate 10 includes multiple alignment regions 12 arranged in the first direction X, and a mounting region 11 that is positioned between two alignment regions 12 among the multiple alignment regions 12 adjacent to each other in the first direction X. The alignment regions 12 and the mounting regions 11 are alternately arranged in the first direction X.

The semiconductor module array device 1 of the embodiment further includes multiple electrode pads 20 located in the mounting region 11, a first metal pad 31 located in the alignment region 12, and a second metal pad 32 located in the alignment region 12. Multiple electrode pads 20 are located in one mounting region 11. The first metal pad 31 and the second metal pad 32 are arranged in the second direction Y in one alignment region 12.

The electrode pads 20 are electrically connected with interconnects formed in the substrate 10. The first metal pad 31 and the second metal pad 32 have an isolated pattern not electrically connected with the electrode pads 20 or the interconnects formed in the substrate 10, and may be connected to a ground potential.

For example, the electrode pad 20 has a rectangular shape including a long side along the second direction Y and a short side along the first direction X. The first metal pad 31 has a rectangular shape including a long side along the second direction Y and a short side along the first direction X. The second metal pad 32 has a rectangular shape including a long side along the first direction X and a short side along the second direction Y. The width in the first direction X of the second metal pad 32 is greater than the width in the first direction X of the first metal pad 31. The first metal pad 31 and the second metal pad 32 have the same shape and the same surface area but mutually-different arrangement orientations, and have, for example, an orthogonal positional relationship. Therefore, although the orientations of the first and second metal pads 31 and 32 are different, the same mounting conditions are applicable if the members to be mounted are the same.

For example, the electrode pad 20, the first metal pad 31, and the second metal pad 32 are simultaneously formed at the surface 10a of the substrate 10 by patterning a metal and include the same material and the same thickness. For example, when the substrate 10 is a resin substrate, the electrode pad 20, the first metal pad 31, and the second metal pad 32 can be formed by forming a Cu foil on the resin substrate, using a photoresist to form a pattern, performing additional Cu plating, removing the photoresist, and performing etching of the entire surface to remove the Cu foil in the regions other than where the additional Cu plating was formed. Because Cu is easily oxidized, generally, Au plating or two-layer plating of Au/Ni is performed on the Cu surface. Instead of Au plating, Sn plating and/or a resin coating that can be removed in the fixation by solder fusion may be formed.

Figure 5:
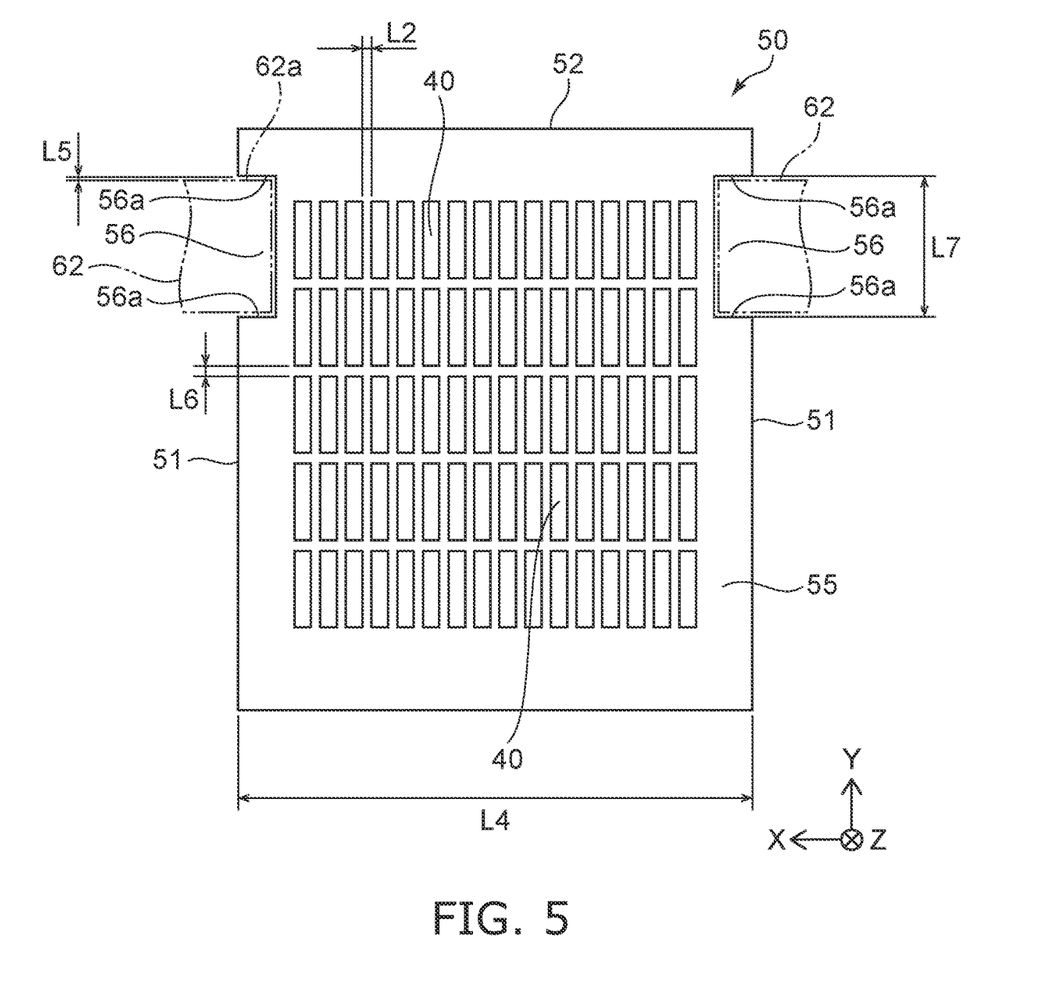
FIG. 5 is a schematic plan view of a terminal placement surface of a semiconductor module of the embodiment.

FIG. 5 is a schematic plan view showing an example of a terminal placement surface 55 of the semiconductor module 50 and corresponds to the backside of the semiconductor module 50 of FIG. 1. The semiconductor module array device 1 of the embodiment further includes multiple module terminals 40 located at the terminal placement surface 55. For example, the shape of the module terminal 40 corresponds to the shape of the electrode pad 20, and is a rectangular shape including a long side along the second direction Y and a short side along the first direction X.

The semiconductor module 50 includes a pair of first side surface parts 51 extending in the second direction Y and a groove part 56 formed in a portion of each first side surface part 51. The groove part 56 is a notch in the terminal placement surface 55; and the notch shape extends in the thickness direction of the semiconductor module 50 (the third direction Z). The second alignment chip 62 (shown by a double dot-dash line in FIG. 5) is positioned in the groove part 56. Accordingly, for example, the groove part 56 extends partway through the semiconductor module 50 in the thickness direction. For example, it is sufficient for the groove part 56 to extend to at least a position in the third direction Z from the terminal placement surface 55 that provides a gap above the height of the second alignment chip 62 so that the semiconductor module 50 does not ride up onto the second alignment chip 62. The groove part 56 may extend all along the thickness direction of the semiconductor module 50. The pair of groove parts 56 are positioned to face each other in the first direction X, e.g., to be parallel to each other. The pair of groove parts 56 may face each other in the first direction X and may be offset in the second direction Y. The first side surface part 51 refers to a portion of a surface adjacent to the terminal placement surface 55 and extends, for example, in the Z-direction. For example, the semiconductor module 50 has a substantially rectangular shape in the plane formed by the first and second directions X and Y.

One groove part 56 includes a pair of inner walls 56a that regulates the movement in the second direction Y of the semiconductor module 50 in the mounting region 11 of the substrate 10. The pair of inner walls 56a are separated in the second direction Y and are, for example, parallel to the first direction X. The pair of inner walls 56a are not limited to being parallel to the first direction X and may be tilted with respect to the first and second directions X and Y.

The semiconductor module 50 is, for example, an optical transmission module. As shown in FIG. 1, for example, multiple optical fibers 80 are connected to the semiconductor module 50 at one side surface part (a second side surface part) 52 of the pair of side surface parts of the semiconductor module 50 extending in the first direction X. The optical fiber 80 extends in the second direction Y from the connection part with the semiconductor module 50.

The semiconductor module 50 can include an optical element optically coupled with the optical fiber 80, and a semiconductor element electrically connected with the optical element. The optical element is a light-receiving element that converts an optical signal from the optical fiber 80 into an electrical signal and transmits the electrical signal to the semiconductor element. Or, the optical element is a light-emitting element that converts an electrical signal from the semiconductor element into an optical signal and transmits the optical signal to the optical fiber 80. The semiconductor element is, for example, an optical receiving IC (Integrated Circuit) chip that performs voltage conversion of the photocurrent of the light-receiving element and outputs a digital electrical signal matched to the logic level of another connected semiconductor logic element. Or, the semiconductor element is an optical transmission IC chip that generates a digital optical signal by changing the drive current of a light-emitting element according to a digital electrical signal transmitted from the other semiconductor logic element.

For example, when the semiconductor module 50 is an optical transmission module, an optical fiber holding member is located at the surface (the second side surface part 52) to which the optical fiber 80 is connected, and it is not always easy to reliably ensure the exterior shape accuracy of the semiconductor module 50. The alignment of the semiconductor module 50 can effectively function by using a configuration that performs the alignment even when the optical fiber holding member is located at the second side surface part 52 by positioning the second alignment chip 62 in the groove part 56.

Figure 2:
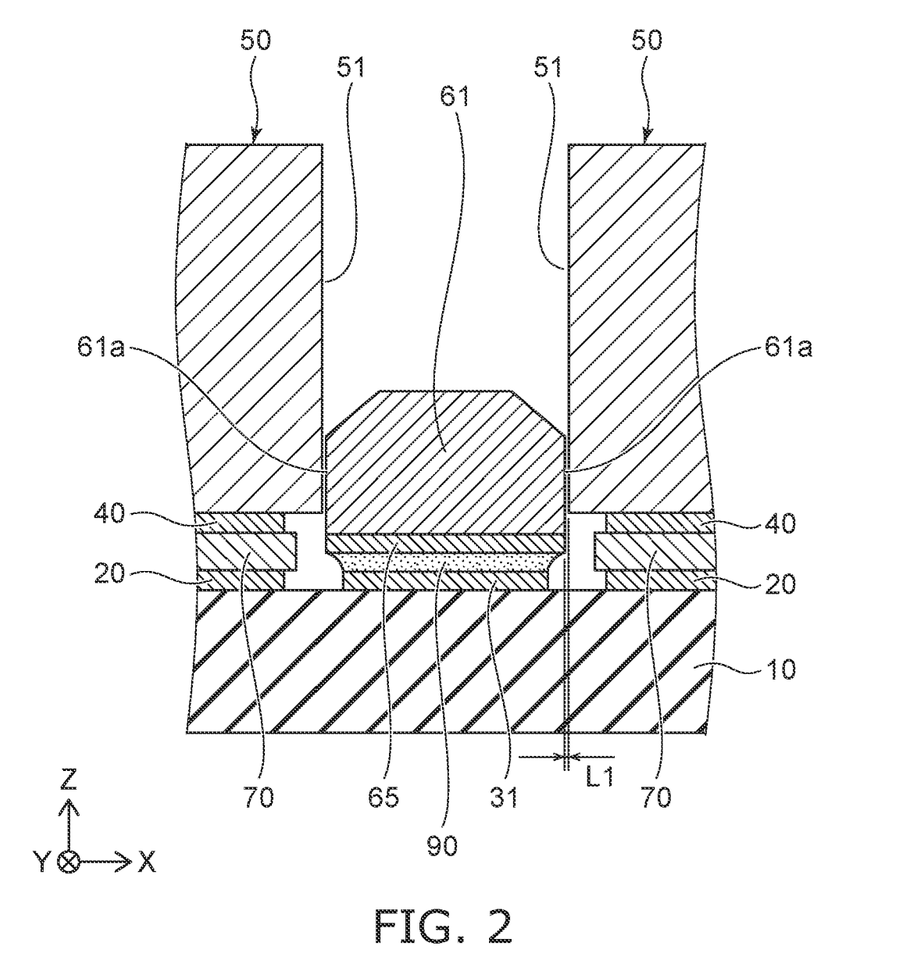
FIG. 2 is an A-A cross-sectional view of FIG. 1.

As shown in FIGS. 1 and 2, a first alignment chip 61 is fixed to the first metal pad 31. For example, silicon, a ceramic ($Al_2O_3$, AlN, etc.), glass, a metal, etc., can be used as the material of the first alignment chip 61. For example, a metal film 65 is located at the surface of the first alignment chip 61 facing the first metal pad 31. The metal film 65 includes, for example, a Au film or a Sn film at the outermost surface; in the case of the Au film, at least a Ni film is included between the Au film and the first alignment chip 61; in the case of the Sn film, at least a Cu film is included between the Sn film and the first alignment chip 61.

The first alignment chip 61 is fixed to the first metal pad 31 by solder 90 (e.g., SnAgCu) located between the metal film 65 and the first metal pad 31. The exterior shape of the metal film 65 is the same as the exterior shape of the first metal pad 31. Or, as shown in FIG. 2, a pattern dimensional difference may be provided in a range such that the exterior edges of the first metal pad 31 and the metal film 65 of the first alignment chip 61 attract each other due to the surface tension when melting the solder 90 so that the center positions of the first alignment chip 61 and the first metal pad 31 are self-aligned. In such a case, the exterior shape of the metal film 65 may be larger than the exterior shape of the first metal pad 31, or the exterior shape of the metal film 65 may be smaller than the exterior shape of the first metal pad 31. It is desirable for the exterior shape of the metal film 65 to be larger than the exterior shape of the first metal pad 31 in a range in which the surface tension when melting the solder 90 is effective. Thus, by such a configuration, the outermost surface of the first alignment chip 61 can be most proximate to the first side surface part 51 of the semiconductor module 50 without the exterior shape of the first metal pad 31 jutting from the exterior shape of the metal film 65.

The second alignment chip 62 is fixed to the second metal pad 32. The same material as the first alignment chip 61 can be used as the material of the second alignment chip 62. Similarly to the first alignment chip 61, the second alignment chip 62 is fixed to the second metal pad 32 by the solder 90 located between the second metal pad 32 and the metal film 65 located at the surface facing the second metal pad 32. The first alignment chip 61 and the second alignment chip 62 are oriented in different directions on the surface 10a of the substrate 10.

The width in the first direction X of the second alignment chip 62 is greater than the width in the first direction X of the first alignment chip 61. For example, the first alignment chip 61 and the second alignment chip 62 have the same type, the same shape, and the same size but mutually-different arrangement orientations. The second alignment chip 62 is, for example, the same chip as the first alignment chip 61 rotated 90° in a plane parallel to the surface 10a of the substrate 10. Because the first alignment chip 61 and the second alignment chip 62 have the same material and the same shape, it is unnecessary to prepare multiple types of alignment chips, the productivity and yield of the alignment chips as an entirety is increased, and it is easy to manage the quality, production volume, etc., of the alignment chips. The mounting productivity of the alignment chips as an entirety also is improved because the mounting process conditions match between the first alignment chip 61 and the second alignment chip 62.

After the first and second alignment chips 61 and 62 are fixed in the alignment region 12 of the substrate 10, the semiconductor modules 50 are mounted in the mounting regions 11 of the substrate 10. One semiconductor module 50 is mounted in one mounting region 11. One semiconductor module 50 is sandwiched between a pair of first alignment chips 61 in the first direction X; and one semiconductor module 50 is sandwiched between a pair of second alignment chips 62 in the first direction X.

The semiconductor module 50 is mounted to the mounting region 11 by being moved downward from above the mounting region 11 so that the terminal placement surface 55 is toward the mounting region 11. At this time, slight gaps are ensured between the first side surface part 51 of the semiconductor module 50 and a side surface 61a of the first alignment chip 61 and between the inner wall of the groove part 56 and a side surface 62a of the second alignment chip 62 so that the first alignment chip 61 and the second alignment chip 62 do not interfere with the mounting of the semiconductor module 50 on the mounting region 11. There are cases where the first side surface part 51 and the side surface 61a of the first alignment chip 61 partially contact due to slight misalignment after mounting the semiconductor module 50. Similarly, there are cases where the inner wall of the groove part 56 and the side surface 62a of the second alignment chip 62 partially contact. The side surface 61a of the first alignment chip 61 and the side surface 62a of the second alignment chip 62 are outermost parts in a direction normal to the surface 10a of the substrate 10 (the third direction Z).

The terminal placement surface 55 of the semiconductor module 50 faces the mounting region 11. For example, the module terminals 40 that are located at the terminal placement surface 55 of the semiconductor module 50 are in direct contact with and electrically connected to the electrode pads 20 located at the mounting region 11. The contact pressure between the module terminals 40 and the electrode pads 20 is maintained by pressing the semiconductor module 50 onto the substrate 10 by a pressing member.

Figure 3:
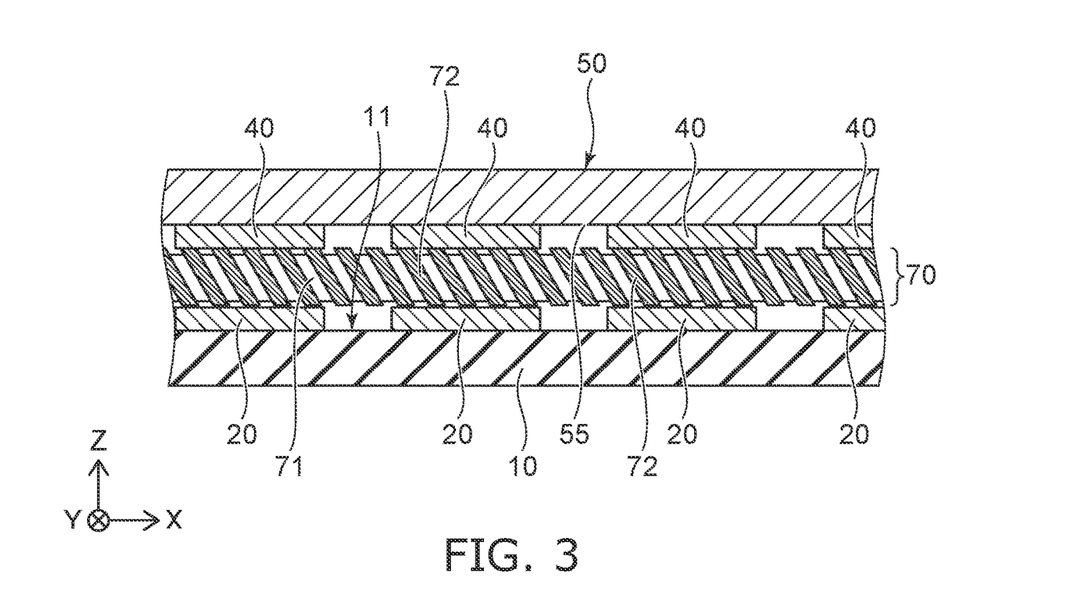
FIG. 3 is an enlarged schematic cross-sectional view of an electrical connection part between electrode pads and module terminals.

Or, as shown in FIG. 3, an anisotropic conductive member 70 is located between the terminal placement surface 55 of the semiconductor module 50 and the mounting region 11 of the substrate 10. The semiconductor module 50 is pressed onto the substrate 10 via the anisotropic conductive member 70 by a pressing member. The anisotropic conductive member 70 includes, for example, an insulating member 71 of a silicone resin or the like, and multiple conductive core wires 72 providing a connection extending between the upper and lower surfaces of the insulating member 71. The module terminal 40 and the electrode pad 20 are electrically connected via the conductive core wires 72 of the anisotropic conductive member 70. By obliquely forming the conductive core wires 72 with respect to the electrical connection direction of the module terminal 40 and the electrode pad 20 (the third direction Z), elastic deformation due to the pressing of the module terminal 40 and the electrode pad 20 toward the anisotropic conductive member 70 can be allowed, and the electrical connectability can be maintained.

When the module terminals 40 and the electrode pads 20 are in direct contact or connected via the anisotropic conductive member 70, in either case, the semiconductor module 50 can be detached from the mounting region 11 and replaced by releasing the pressure by the pressing member.

The pair of first side surface parts 51 of the semiconductor module 50 each face the side surface 61a of the first alignment chip 61. A slight gap is between the first side surface part 51 of the semiconductor module 50 and the side surface 61a of the first alignment chip 61. Or, the first side surface part 51 of the semiconductor module 50 and the side surface 61a of the first alignment chip 61 may contact due to slight misalignment after mounting the semiconductor module 50.

The movement in the first direction X of one semiconductor module 50 is regulated by the semiconductor module 50 being sandwiched to be a pair of first alignment chips 61 in the first direction X. Also, the movement in the first direction X of two semiconductor modules 50 is regulated by one first alignment chip 61 by the first alignment chip 61 being sandwiched between the two semiconductor modules 50 in the first direction X. The misalignment in the first direction X between the module terminals 40 and the electrode pads 20 is regulated thereby. Also, the first alignment chip 61 and the second alignment chip 62 regulate the rotation of the semiconductor module 50 in a plane parallel to the surface 10a of the substrate 10.

A portion of the second alignment chip 62 is positioned in each of the pair of groove parts 56 of the semiconductor module 50. The side surface 62a of the second alignment chip 62 faces the inner wall of the groove part 56. A slight gap is between the inner wall of the groove part 56 and the side surface 62a of the second alignment chip 62. Or, the inner wall of the groove part 56 and the side surface 62a of the second alignment chip 62 may contact each other due to slight misalignment after mounting the semiconductor module 50.

The movement in the second direction Y of the semiconductor module 50 is regulated by a pair of inner walls 56a of the groove part 56 shown in FIG. 5 that are separated from each other in the second direction Y. The movement in the second direction Y of two semiconductor modules 50 is regulated by one second alignment chip 62 by sandwiching the second alignment chip 62 between the two semiconductor modules 50 in the first direction X. The misalignment in the second direction Y between the module terminals 40 and the electrode pads 20 is regulated thereby.

The optical fiber 80 extends in the second direction Y from the second side surface part 52 positioned between the pair of first side surface parts 51. The orientation of the semiconductor module 50 with respect to the substrate 10 is limited by the optical fiber 80 when the semiconductor module 50 is mounted on the substrate 10. By using only the pair of groove parts 56 as the structure for positioning the semiconductor module 50 in the second direction Y, the semiconductor module 50 can be accurately aligned in the mounting region 11 of the substrate 10 even if the orientation of the semiconductor module 50 is tilted with respect to the substrate 10 in the plane formed by the second and third directions Y and Z because the semiconductor module 50 engage with the second alignment chip 62 by sliding in the second direction Y while being inserted between the first alignment chips 61. Subsequently, because the semiconductor module 50 is pressed onto the substrate 10 by a pressing member, the semiconductor module 50 is fixed so that the semiconductor module 50 and the substrate 10 are parallel and the positions in the first and second directions X and Y are accurately aligned; and an external force applied to the optical fiber 80 does not cause misalignment of the semiconductor module 50.

Although the first alignment chip 61 and the second alignment chip 62 have substantially rectangular parallelepiped shapes, shapes that have beveled corner parts may be used. When beveled, the first alignment chip 61 and the second alignment chip 62 do not easily interfere with the semiconductor module 50 physically when the semiconductor module 50 is mounted on the substrate 10. As shown in FIG. 1, the first alignment chip 61 and the second alignment chip 62 perform the alignment in the first and second directions X and Y only by having the same shape and different mounting orientations. To this end it is necessary for the alignment chip to have asymmetric dimensions in the first and second directions X and Y on the surface 10a of the substrate 10 such as those of, for example, a rectangular shape. To realize a similar function using the first alignment chip 61 and the second alignment chip 62 that have the same shape, for example, similar configurations are possible when the shape of the alignment chip on the surface 10a of the substrate 10 is triangular or diamond-shaped.

According to the embodiment, by using the first alignment chip 61 and the second alignment chip 62 in a compact and simple configuration without using a socket, etc., the semiconductor module 50 can be accurately aligned in the mounting region 11 of the substrate 10; and the module terminals 40 and the electrode pads 20 can be electrically connected with high reliability. Also, the multiple semiconductor modules 50 can be arranged in the first direction X at a minimum pitch between the minimum width that can secure the mechanical strength of the first alignment chip 61.

The distance in the first direction X between the side surfaces 61a of two first alignment chips 61 adjacent to each other in the first direction X, the distance in the first direction X between the side surfaces 62a of two second alignment chips 62 adjacent to each other in the first direction X, and the distance in the second direction Y between the side surface 61a of the first alignment chip 61 and the side surface 62a of the second alignment chip 62 adjacent to each other in the second direction Y are different from each other.

It is favorable for a maximum distance L1 in the first direction X between the side surface 61a of the first alignment chip 61 and the first side surface part 51 of the semiconductor module 50 (shown in FIG. 2) to be less than a distance L2 in the first direction X between two module terminals 40 adjacent to each other in the first direction X (shown in FIG. 5). It is favorable for the difference (L3−L4) between the distance L3 between two first alignment chips 61 adjacent to each other in the first direction X (shown in FIG. 1) and the length L4 in the first direction X of the semiconductor module 50 at a part other than the groove part 56 (shown in FIG. 5) to be less than the distance L2. It is favorable for a maximum distance L5 in the second direction Y between the side surface 62a of the second alignment chip 62 and the inner wall 56a of the groove part 56 of the semiconductor module 50 (shown in FIG. 5) to be less than a distance L6 in the second direction Y of two module terminals 40 adjacent to each other in the second direction Y (shown in FIG. 5). It is favorable for the difference (L7−L8) between the distance L7 in the second direction Y between a pair of inner walls 56a (shown in FIG. 5) and the length L8 in the second direction Y of the second alignment chip 62 (shown in FIG. 1) to be less than the distance L6.

Thereby, a highly reliable connection is possible even when the pitch of the multiple module terminals 40 is reduced.

The first alignment chip 61 and the second alignment chip 62 are not limited to solder connections and may be fixed respectively to the first and second metal pads 31 and 32 by resin bonding or direct metal bonding. However, when solder is used, the first alignment chip 61 and the second alignment chip 62 can be easily and accurately aligned with the first and second metal pads 31 and 32 by the self-alignment effect due to the surface tension when melting the solder.

The first alignment chip 61 and the second alignment chip 62 have the same type, the same shape, and the same size but different arrangement orientations. Compared to when the first alignment chip 61 and the second alignment chip 62 of different shapes, sizes, etc., are prepared, costs can be lower in terms of productivity and yield by using chips (e.g., ceramic chips) cut out from the same wafer as the first and second alignment chips 61 and 62.

Both the first and second alignment chips 61 and 62 can be made by preparing rectangular chips of the same size and by changing only the arrangement orientation. The length of the short side of the rectangular chip is set to be slightly less than the distance in the first direction X between the first side surface parts 51 of the semiconductor modules 50 adjacent to each other in the first direction X. The length of the short side of the rectangular chip is set to be slightly less than the distance in the second direction Y between the inner walls 56a of the groove part 56 shown in FIG. 5. The length of the long side of the rectangular chip is set to a length such that the side surfaces at the long sides of the chip can face the inner walls 56a of the groove parts 56 of the semiconductor modules 50 adjacent to each other in the first direction X.

The semiconductor module 50 is not limited to an optical transmission module. For example, a configuration may be used in which multiple electrical interconnects are connected to the semiconductor module 50 at the second side surface part 52 of the semiconductor module 50.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor module array device, comprising:
   a substrate including a surface, the surface including
      a plurality of alignment regions arranged in a first direction, and
      a mounting region positioned between two adjacent alignment regions among the plurality of alignment regions in the first direction;
   a plurality of electrode pads located in the mounting region;
   a first metal pad and a second metal pad arranged in a second direction in the alignment region, the second direction being orthogonal to the first direction;
   a plurality of semiconductor modules mounted in the mounting region of the substrate, the plurality of semiconductor modules including terminal placement surfaces facing the mounting region;
   a plurality of module terminals located at the terminal placement surface, the plurality of module terminals being electrically connected with the electrode pads; and
   a plurality of alignment chips having a same shape,
   a distance between outermost parts of the alignment chips in a direction normal to the surface of the substrate being different between the first direction and the second direction along the terminal placement surfaces,
   the plurality of alignment chips including
      a first alignment chip fixed to the first metal pad, and
      a second alignment chip fixed to the second metal pad,
   the first alignment chip and the second alignment chip being oriented in different directions on the surface of the substrate,
   the semiconductor module including
      a first side surface part extending in the second direction and facing the first alignment chip, and
      a groove part formed in a portion of the first side surface part,
   a portion of the second alignment chip being positioned in the groove part.

2. The device according to claim 1, wherein
   a distance L1 in the first direction between the first alignment chip and the first side surface part of the semiconductor module is less than a distance L2 in the first direction between two adjacent module terminals among the plurality of module terminals.

3. The device according to claim 1, wherein
   a distance L5 in the second direction between the second alignment chip and a sidewall of the groove part of the semiconductor module is less than a distance L6 in the second direction between two adjacent module terminals among the plurality of module terminals.

4. The device according to claim 1, wherein
   the first alignment chip and the second alignment chip are fixed respectively to the first and second metal pads by one of a solder connection, resin bonding, or direct metal bonding.

5. The device according to claim 1, further comprising:
   an anisotropic conductive member located between the mounting region of the substrate and the terminal placement surface of the semiconductor module,
   the anisotropic conductive member electrically connecting the electrode pads and the module terminals.

6. The device according to claim 1, wherein
   the shape of the first and second alignment chips is one of rectangular, triangular, or diamond-shaped when viewed from above the surface of the substrate, and
   arrangement orientations are different between the shape of the first alignment chip and the shape of the second alignment chip.

7. The device according to claim 1, further comprising:
   an optical fiber extending in the second direction,
   the optical fiber being connected to the semiconductor module at a second side surface part of the semiconductor module,
   the second side surface part extending in the first direction.

8. The device according to claim 7, wherein
   the semiconductor module includes:
      an optical element optically connected with the optical fiber; and
      a semiconductor element electrically connected with the optical element.

9. The device according to claim 1, wherein
the electrode pad is electrically connected with an interconnect formed in the substrate, and
the first metal pad and the second metal pad are not electrically connected with the interconnect.

10. The device according to claim 1, wherein
the electrode pad has a rectangular shape including a long side along the second direction and a short side along the first direction.

11. The device according to claim 1, wherein
the module terminal has a rectangular shape including a long side along the second direction and a short side along the first direction.

12. The device according to claim 1, wherein
the first metal pad has a rectangular shape including a long side along the second direction and a short side along the first direction, and
the second metal pad has a rectangular shape including a long side along the first direction and a short side along the second direction.

13. The device according to claim 12, wherein
the rectangular shape of the first metal pad and the rectangular shape of the second metal pad have an orthogonal positional relationship.

14. The device according to claim 1, wherein
a difference $L3-L4$ between a distance $L3$ in the first direction between two adjacent first alignment chips among the plurality of first alignment chips and a length $L4$ in the first direction of the semiconductor module at a part of the semiconductor module other than the groove part is less than a distance $L2$ in the first direction of two adjacent module terminals among the plurality of module terminals.

15. The device according to claim 1, wherein
a difference $L7-L8$ between a distance $L7$ in the second direction between inner walls of the groove parts and a length $L8$ in the second direction of the second alignment chip is less than a distance $L6$ in the second direction between two adjacent module terminals among the plurality of module terminals.

* * * * *